US012641707B2

(12) United States Patent
Lin et al.

(10) Patent No.: US 12,641,707 B2
(45) Date of Patent: May 26, 2026

(54) GROUND POINT FIXING DEVICE FOR POWER SUPPLY MODULE

(71) Applicant: ACBEL POLYTECH INC., New Taipeii City (TW)

(72) Inventors: Yu-Heng Lin, New Taipei City (TW); Cheng-Chi Yang, New Taipeii City (TW); Yung-Han Kuo, New Taipeii City (TW)

(73) Assignee: ACBEL POLYTECH INC., New Taipei City (TW)

( * ) Notice: Subject to any disclaimer, the term of this patent is extended or adjusted under 35 U.S.C. 154(b) by 343 days.

(21) Appl. No.: 18/388,204

(22) Filed: Nov. 9, 2023

(65) Prior Publication Data

US 2024/0244740 A1     Jul. 18, 2024

(51) Int. Cl.
H05K 5/00          (2025.01)
H01R 4/30          (2006.01)
H05K 1/02          (2006.01)

(52) U.S. Cl.
CPC ........... H05K 1/0215 (2013.01); H01R 4/305 (2013.01)

(58) Field of Classification Search
None
See application file for complete search history.

(56) References Cited

U.S. PATENT DOCUMENTS 5,471,089 A * 11/1995 Nagatomo ............ H01L 23/645
                                          257/E23.079
6,643,137 B1 * 11/2003 Chung .................. H01L 23/367
                                          174/16.3

| | | | | |
|---|---|---|---|---|
| 8,430,692 | B2 * | 4/2013 | Peng ................... | H01R 13/6594 |
| | | | | 439/95 |
| 9,076,660 | B2 * | 7/2015 | Kim ...................... | H01L 23/053 |
| 9,831,617 | B1 * | 11/2017 | Hong ................... | H05K 1/0231 |
| 2009/0004893 | A1 * | 1/2009 | Fan ...................... | H05K 7/1007 |
| | | | | 439/74 |
| 2009/0162006 | A1 * | 6/2009 | Yamanouchi ........... | G02B 6/43 |
| | | | | 385/136 |
| 2012/0058675 | A1 * | 3/2012 | Hofer ................. | H01R 13/6616 |
| | | | | 439/620.21 |
| 2014/0302692 | A1 * | 10/2014 | Raff ..................... | H01R 12/716 |
| | | | | 439/65 |
| 2017/0093146 | A1 * | 3/2017 | Gao ...................... | H02H 3/335 |
| 2022/0416481 | A1 * | 12/2022 | Zhou ................. | H01R 13/6658 |
| 2024/0244740 | A1 * | 7/2024 | Lin ......................... | H01R 4/305 |
| 2024/0372344 | A1 * | 11/2024 | Lin ...................... | H05K 7/1427 |

* cited by examiner

*Primary Examiner* — Imani N Hayman
*Assistant Examiner* — Rashen E Morrison
(74) *Attorney, Agent, or Firm* — WPAT, PC

(57)          ABSTRACT

A ground point fixing device for a power supply module includes an engaging part and a fastening part. The engaging part includes an engaging body, a joining portion and an engaging portion. The engagement body has a body outer diameter and a body surface larger than a grounding hole on a power supply module circuit board. The joining portion is disposed on the body surface and has a joining portion outer diameter smaller than the grounding hole. The engagement portion is disposed on the body surface and around an outer circumference of the joining portion. The joining portion is passed through the grounding hole to be connected to the fastening part, so that the engagement portion of the engaging part is engaged in the grounding hole, and the fastening part and the engagement body of the engaging part are respectively fixed on an upper surface and a lower surface of the circuit board.

7 Claims, 14 Drawing Sheets

GROUND POINT FIXING DEVICE FOR POWER SUPPLY MODULE

CROSS REFERENCE TO RELATED APPLICATION(S)

This application claims the priority to patent application No. 112200674 filed in Taiwan on Jan. 18, 2023, which is hereby incorporated in its entirety by reference into the present application.

BACKGROUND OF THE INVENTION

1. Field of the Invention

The invention relates to a ground point fixing device, and particularly relates to a ground point fixing device for a power supply module.

2. Description of the Related Art

Power supply modules are widely used electronic products, and their internal structures are designed to increase the internal power density within a fixed space size. In the case of increasing power density, it is necessary to consider the selection and placement of the internal components, the layout of the circuit boards, and the design of the overall internal structures.

Further, circuit board grounding structure of today's power supply module uses wires to electrically connect to ground points on a circuit board. However, the electrical connection structure of the wires not only takes up space, affects the space utilization of a power supply module, and is not conducive to assembly; moreover, the wires are also susceptible to damages from extrusion, stress, and scratches.

As mentioned above, another approach is to utilize soldering to electrically connect ground points on a circuit board. However, according to safety regulations, soldering alone cannot be the only structure for protection and fixation; instead, a double fixation structure is required to comply with the safety regulations.

In other words, in consideration of high efficiency, high wattage, and high component density design, it is necessary to effectively utilize the internal space of the power supply module while complying with safety regulations.

Accordingly, how to provide a ground point fixing device for a power supply module is an urgent research topic.

SUMMARY OF THE INVENTION

The present invention discloses a ground point fixing device for a power supply module, which includes an engaging part and a fastening part. The engaging part includes an engaging body, a joining portion and an engaging portion. The engagement body has a body outer diameter and a body surface, and the body outer diameter is larger than a grounding hole of the power supply module circuit board. The joining portion is disposed on the body surface and has a joining portion outer diameter smaller than the grounding hole. The engagement portion is disposed on the body surface and around an outer circumference of the joining portion. The joining portion is passed through the grounding hole to be connected to the fastening part, so that the engagement portion of the engaging part is engaged in the grounding hole, and the fastening part and the engagement body of the engaging part are respectively fixed on a first surface and a second surface of the circuit board wherein the second surface is opposite to the first surface, and where the ground point fixing device is provided below conductor pins of the power supply module.

In view of the above, the ground point fixing device for a power supply module of the present invention can achieve a double stabilizing effect for the circuit board grounding point that complies with safety regulations through the engaging structure of the engaging part and the fastening structure of the fastening part. In addition, regarding arrangement of the internal space of the power supply module, the present invention can more effectively utilize the internal space of the power supply module by disposing the ground point fixing device below the conductor pin of the power supply module.

In order to make the above objects, features and advantages of the present invention more apparent and easy to understand, the following embodiments, together with the accompanying drawings, are described in detail as follows.

DETAILED DESCRIPTION OF THE INVENTION

The technical contents, features and effects of the present invention will be clearly presented in the following detailed description of the preferred embodiment with reference to the drawings. In addition, the directional terms mentioned in the following embodiments, such as: up, down, left, right, front, back, bottom, top, etc., are only relative directions with reference to the drawings, and do not represent absolute directional positions; therefore, the directional terms used are for the convenience of illustrating their relative positional relationships, and are not intended to impose limitations on the present invention.

Figure 1A:
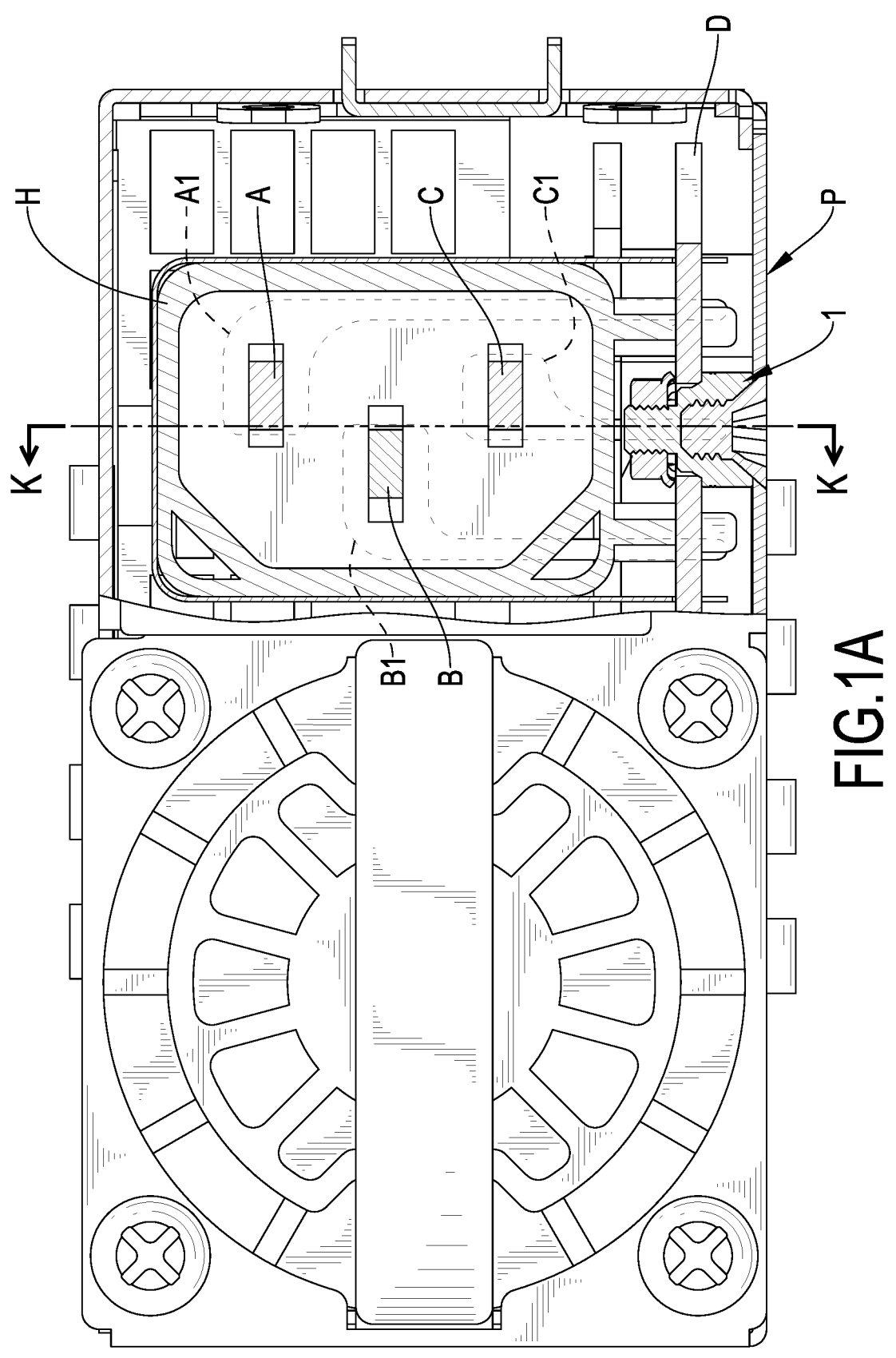
FIGS. 1A, 1B and 2 are a front sectional view, a rear sectional view and a side cross-sectional view of the first embodiment of the ground point fixing device for a power supply module of the present invention, as the ground point fixing device disposed below the conductive pins of the power supply module.
Figure 1B:
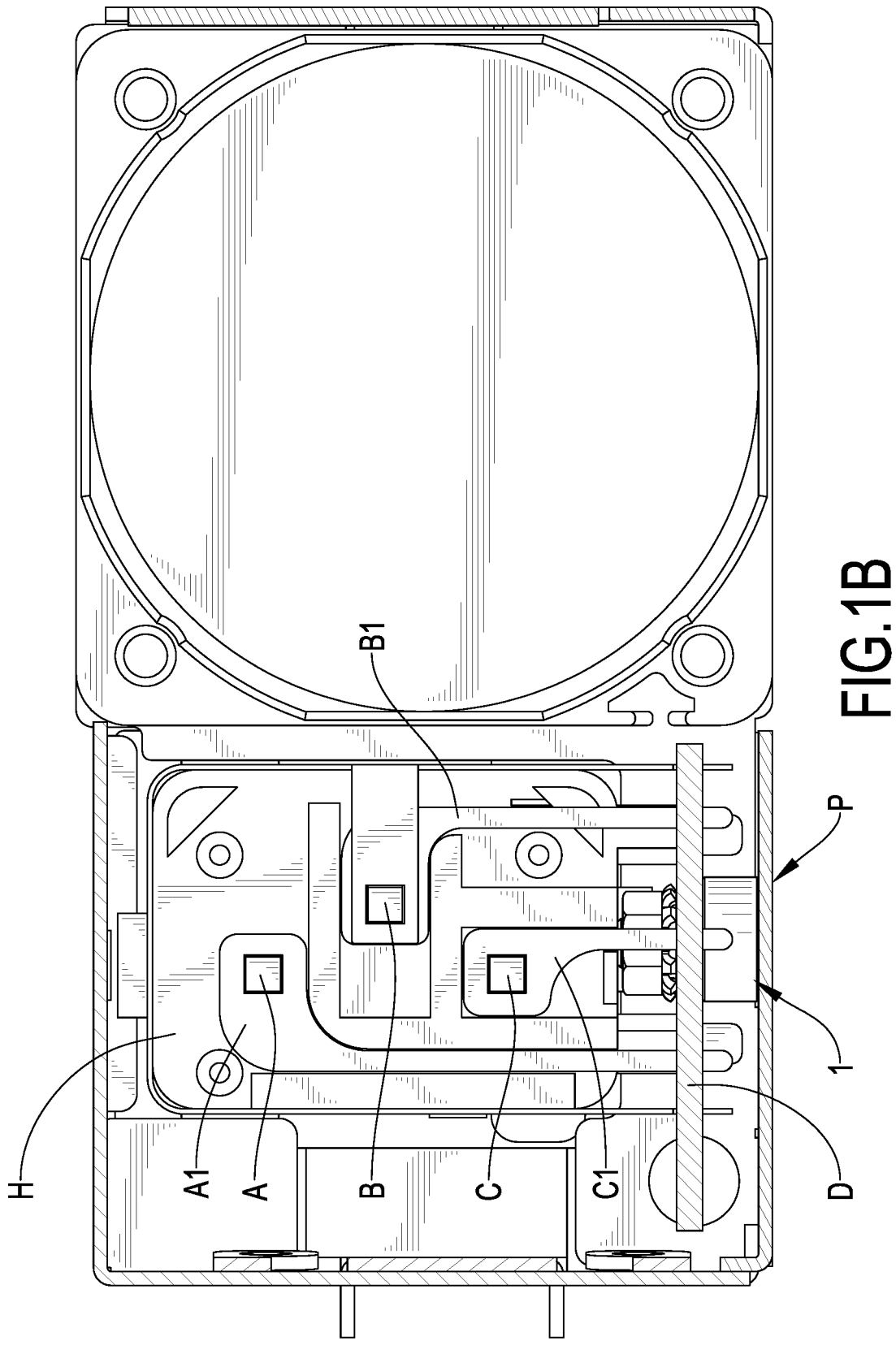
Figure 2:
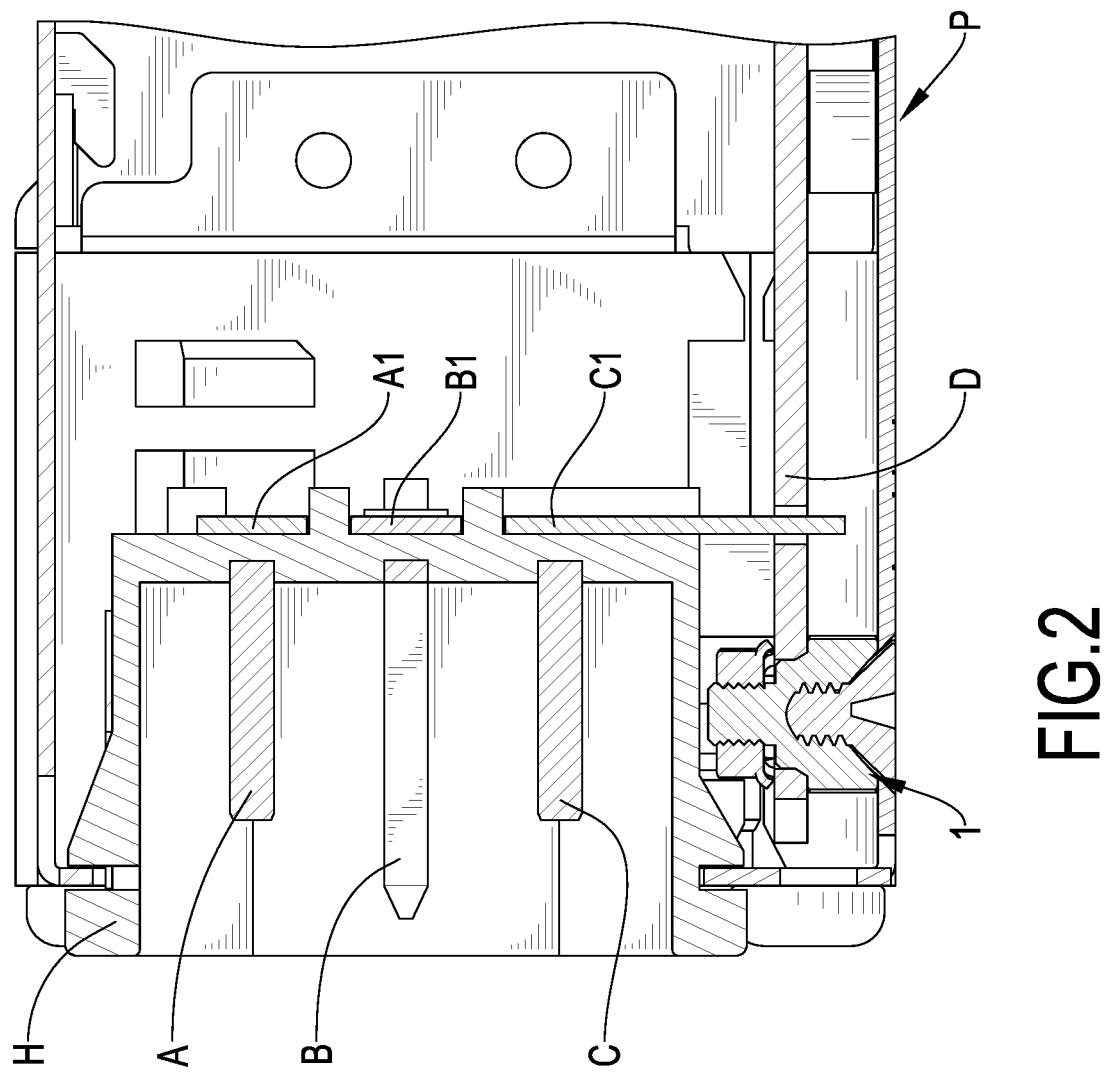
Figure 3:
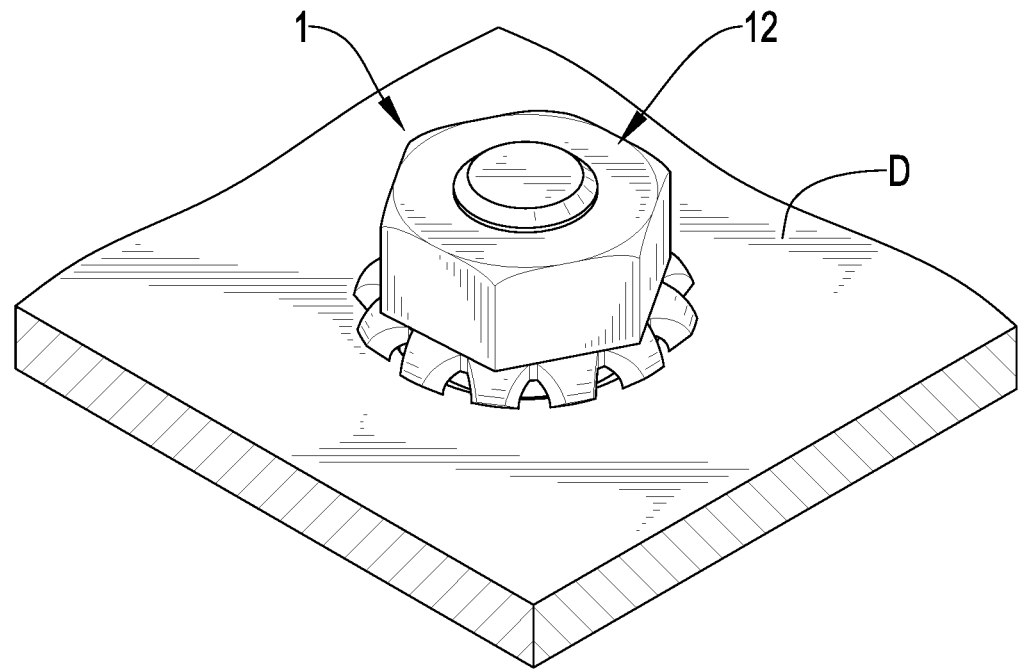
FIGS. 3, 4, 5A and 5B are a perspective view, an exploded view and schematic cross-sectional views of the first embodiment of the ground point fixing device for a power supply module of the present invention.

Please refer to FIG. 1A, FIG. 1B and FIG. 2, which are a front cross-sectional view, a rear cross-sectional view and a side cross-sectional view of the first embodiment of the ground point fixing device for a power supply module of the present invention in which the ground point fixing device 1 is disposed below conductor pins of a power supply module. The power supply module contains three conductor pins A, B, and C. One end of each of the three conductor pins A, B, and C is inserted through a back of a socket H. The back of the socket H is provided with three pins A1, B1, and C1, and the three pins A1, B1, and C1 are disposed in one direction perpendicular to the conductor pins A, B, and C. An upper end of each of the three pins A1, B1, and C1 is electrically connected to the three conductor pins A, B, and C respectively, and a lower end of each of the three pins A1, B1, and C1 respectively extends downward penetrating and fixed on a circuit board D, where the conductor pin B among the conductor pins A, B, and C is a ground pin, and is electrically connected to a ground point on the circuit board D, wherein the ground point fixing device 1 for the power supply module of the present invention is disposed below the socket H of the power supply module. Wherein, section line K shown in FIG. 1A is a cross-sectional direction corresponding to the viewing angle that produces the side cross-sectional view shown in FIG. 2.

Please refer to FIGS. 3, 4, 5A and 5B, which are a perspective view, an exploded view and a schematic cross-sectional view of the first embodiment of the ground point fixing device for a power supply module of the present invention.

The ground point fixing device 1 for a power supply module includes an engaging part 11 and a fastening part 12. The engaging part 11 includes an engagement body 111, a joining portion 112 and an engagement portion 113. The engagement body 111 has a body outer diameter L3 and a body surface 111F. The body outer diameter L3 is larger than a hole diameter of a grounding hole D1 of the power supply module circuit board D. The joining portion 112 is disposed on the body surface 111F and has a joining portion outer diameter L1, which is smaller than the hole diameter of the grounding hole D1. The engagement portion 113 is disposed on the body surface 111F and around an outer circumference of the joining portion 112 corresponding to the joining portion outer diameter L1. As the joining portion 112 penetrating through the grounding hole D1 to connect the fastening part 12, the engagement portion 113 of the engaging part 11 is engaged in the grounding hole D1, such that the fastening part 12 and the engagement body 111 of the engaging part 11 are respectively fixed on a first surface and a second surface which are opposite surfaces of the circuit board D. According to a direction shown in the figures, the first and the second surfaces correspond to an upper surface and a lower surface of the circuit board D.

In one embodiment of the present invention, the joining portion 112 is a screw body, the engagement body 111 is a screw head, the fastening part 12 is a screw nut, and the outer diameter of the screw nut is larger than the hole diameter of the grounding hole D1. By combining the threads on the screw body with the screw nut, the circuit board D can be secured between the screw nut and the screw head.

The fastening part 12 includes an outer diameter periphery and a pressing portion 121. The pressing portion 121 is disposed around the outer diameter periphery and pressed against the upper surface of the circuit board D. In one embodiment of the present invention, the pressing portion 121 is a pawl disposed around the outer diameter periphery of the bottom surface of the screw nut, so that after the screw nut is locked, the surface of the circuit board D can be tightly pressed through the pawl.

Figure 4:
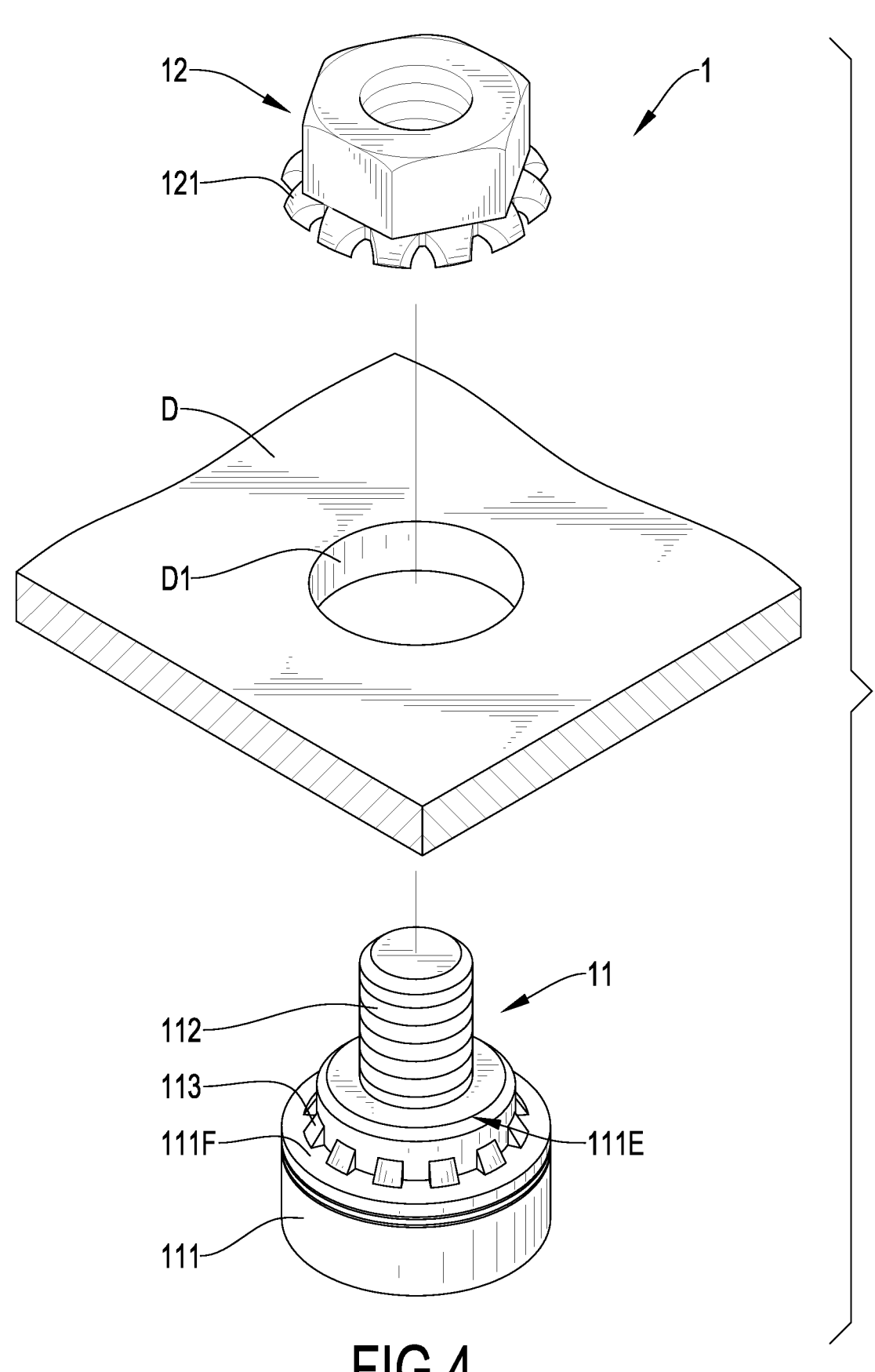
Figure 5A:
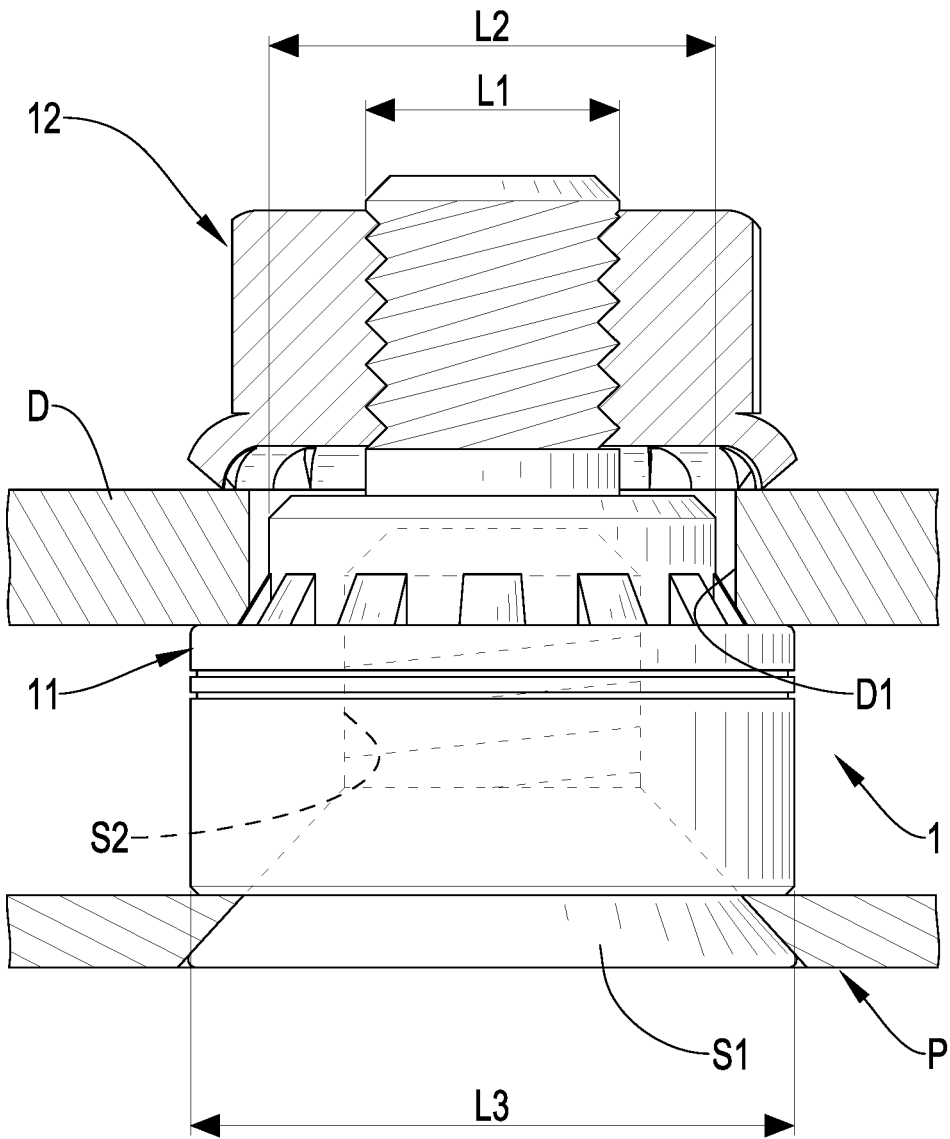
Figure 5B:
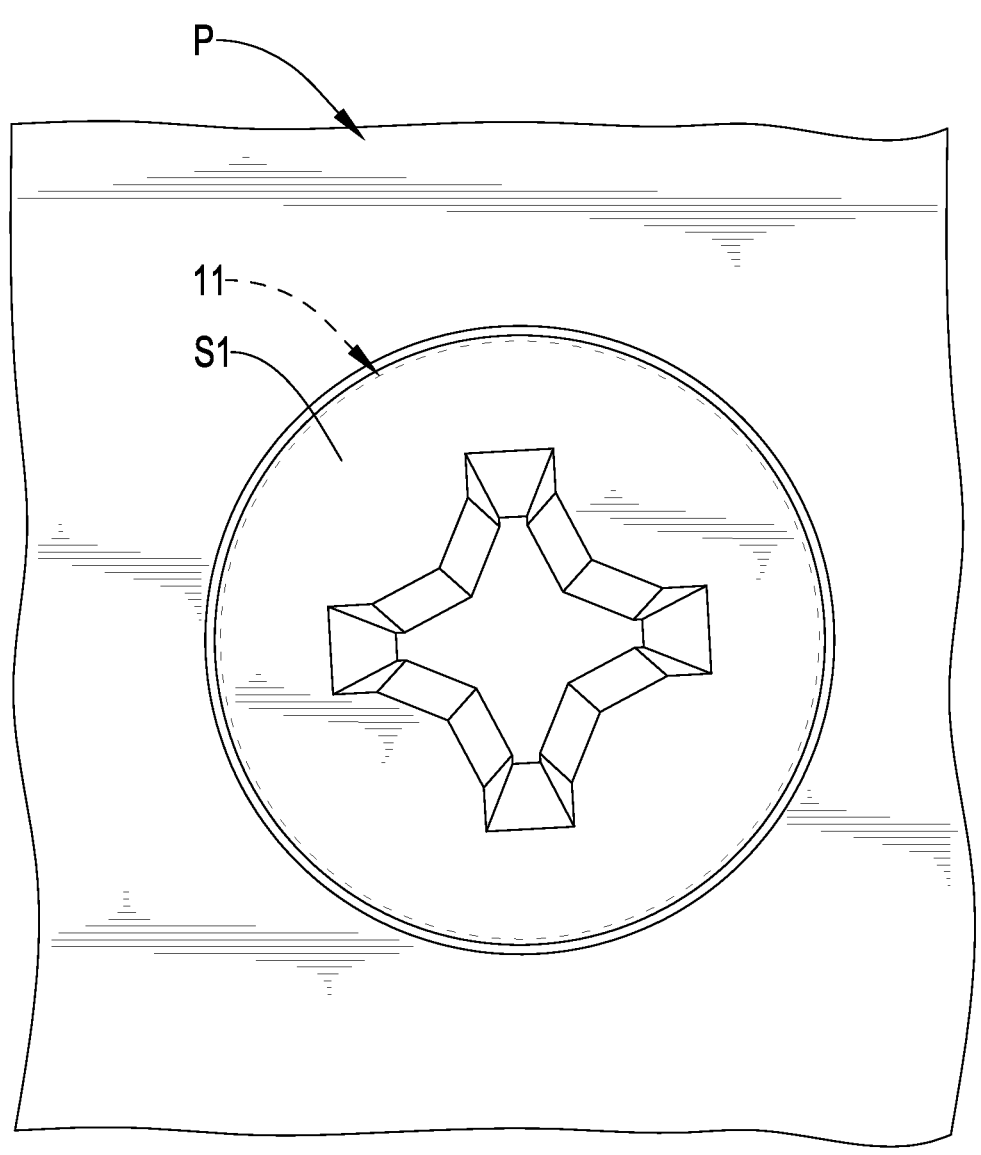
Figure 6:
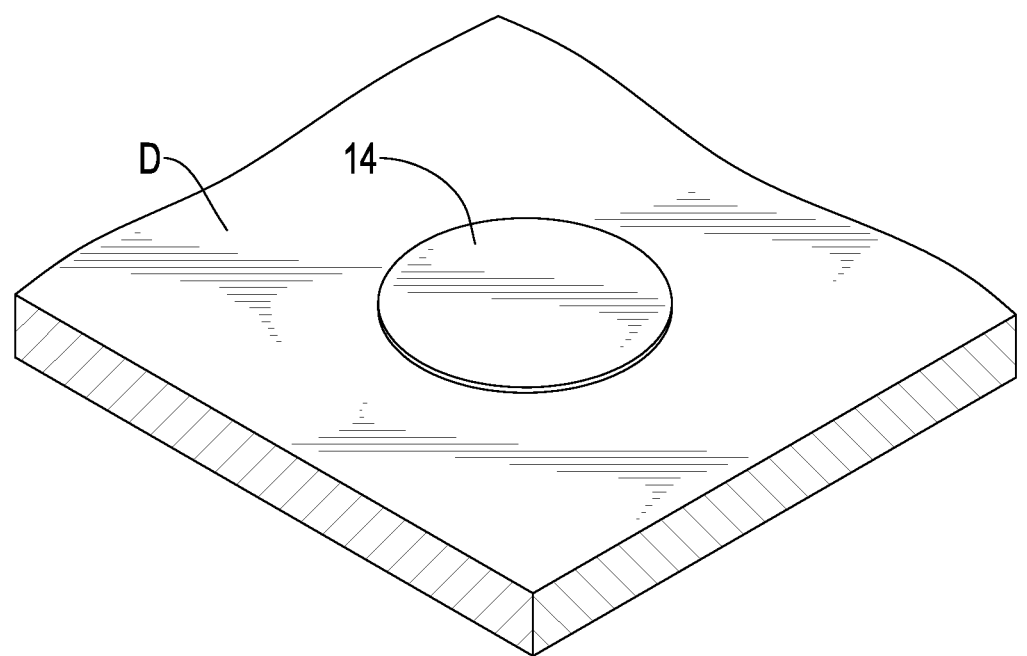
FIGS. 6, 7, 8A and 8B are a perspective view, an exploded view and schematic cross-sectional views of the second embodiment of the ground point fixing device for a power supply module of the present invention.

As shown in FIG. 4 and FIG. 5A, the engagement body 111 of the engaging part 11 includes a base portion 111E. The base portion 111E is disposed on the body surface 111F and has a base outer diameter L2. The base outer diameter L2 is smaller than the hole diameter of the grounding hole D1. The joining portion 112 is disposed on top of the base portion 111E, and the engagement portion 113 is disposed around an outer circumference of the base portion 111E corresponding to the base outer diameter L2. Since the base outer diameter L2 is smaller than the hole diameter of the grounding hole D1 and larger than the joining portion outer diameter L1, when the engaging part 11 is passed through the grounding hole D1, the engagement portion 113 can be firmly engaged with the grounding hole D1. In addition, as shown in FIGS. 5A and 5B, there is a screw hole S2 behind the back of the engaging part 11. Through the screw hole S2, a user can conveniently use a screw S1 to lock the engaging part 11 in the grounding hole D1. Furthermore, the surface of the screw S1 locked in the screw hole S2 contacts a casing P of the power supply module to electrically connect the casing P and the pin B1.

In one embodiment of the present invention, the engagement portion 113 includes a plurality of wedge-shaped blocks. The wedge-shaped block has a wedge-shaped surface. The wedge-shaped surface is an inclined surface. An inner edge of the grounding hole D1 is located on the inclined surface. That is, the inner edge of the grounding hole D1 is in contact with the inclined surface before being subjected to pressing force. When the engaging part 11 is combined with the fastening part 12, the inner edge of the grounding hole D1 is pressed by a pressing force, causing the slope of the wedge-shaped block to contact the inner edge of the grounding hole D1, and is firmly engaged with the inner edge of the grounding hole D1 through the force of compression and tightening. When the slope of the wedge-shaped block and the edge of the grounding hole D1 are compressed and tightened to a maximum, the body surface 111F of the engagement body 111 of the engaging part 11 can be brought into contact with the lower surface of the circuit board D.

Figure 7:
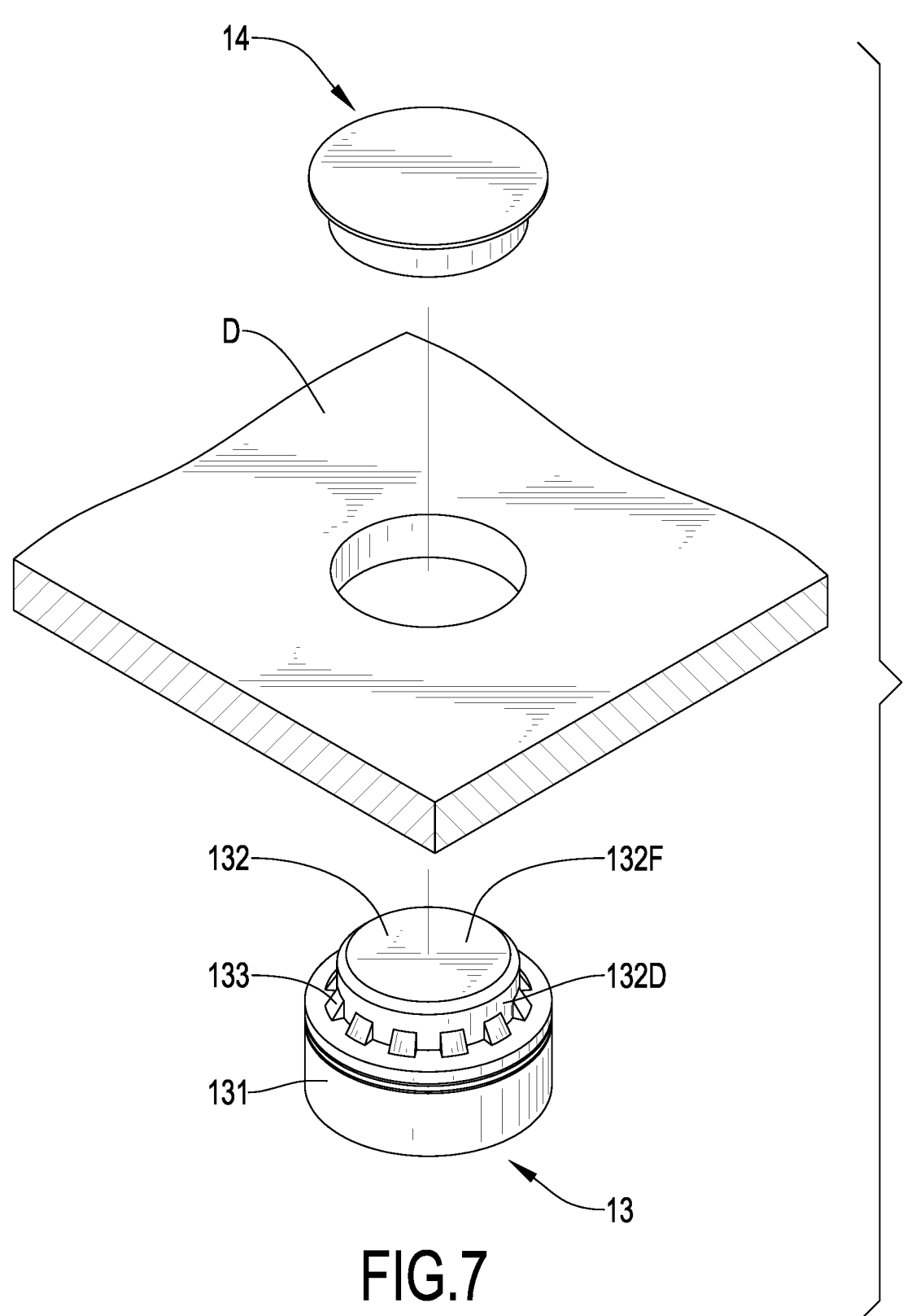
Figure 8A:
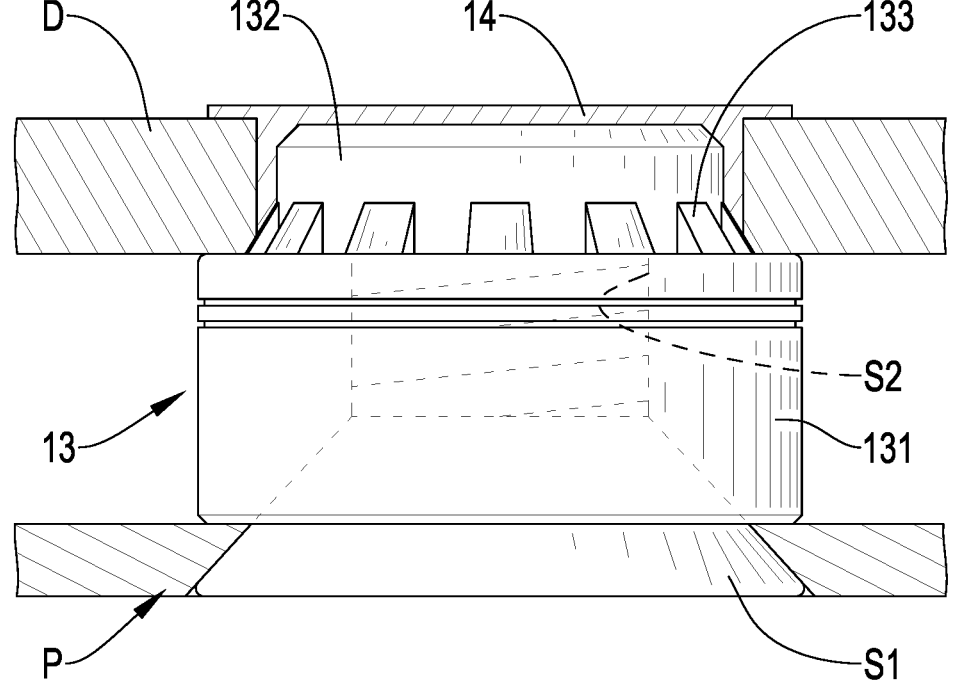
Figure 8B:
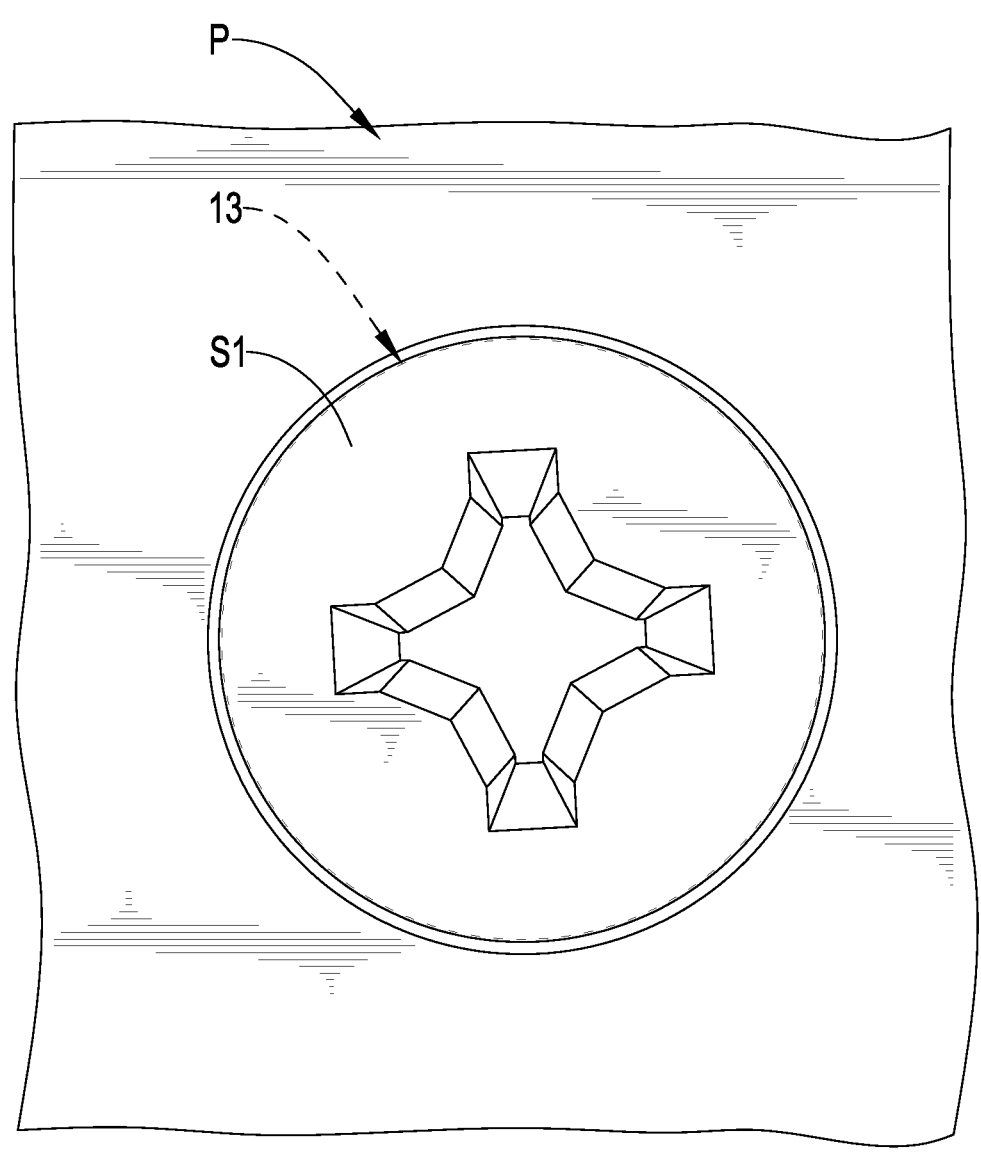

Please refer to FIGS. 6, 7, 8A and 8B, which are a perspective view, an exploded view, a schematic side cross-sectional view and a top view of the second embodiment of the ground point fixing device for a power supply module of the present invention. As shown in FIG. 7, in this embodiment, the engaging part 13 includes an engagement body 131, a joining portion 132 and an engagement portion 133. The joining portion 132 is a connector column, the fastening part 14 is solder, and the solder is reflowed to connect an outer diameter periphery 132D of the joining portion 132 and a connecting surface 132F of the joining portion 132; as a result, the engaging part 13 and fastening part 14 are stabilized on the upper and lower surfaces of the circuit board D. When the engaging part 13 is engaged in the grounding hole D1 of the circuit board D through the engagement portion 133, the engaging part 13 can be further stably fixed in the grounding hole D1 of the circuit board D through the connection with the fastening part 14. The structure of the engagement portion and the state of engagement with the circuit board D are as described in the above embodiments, and will not be described again here.

Figure 9:
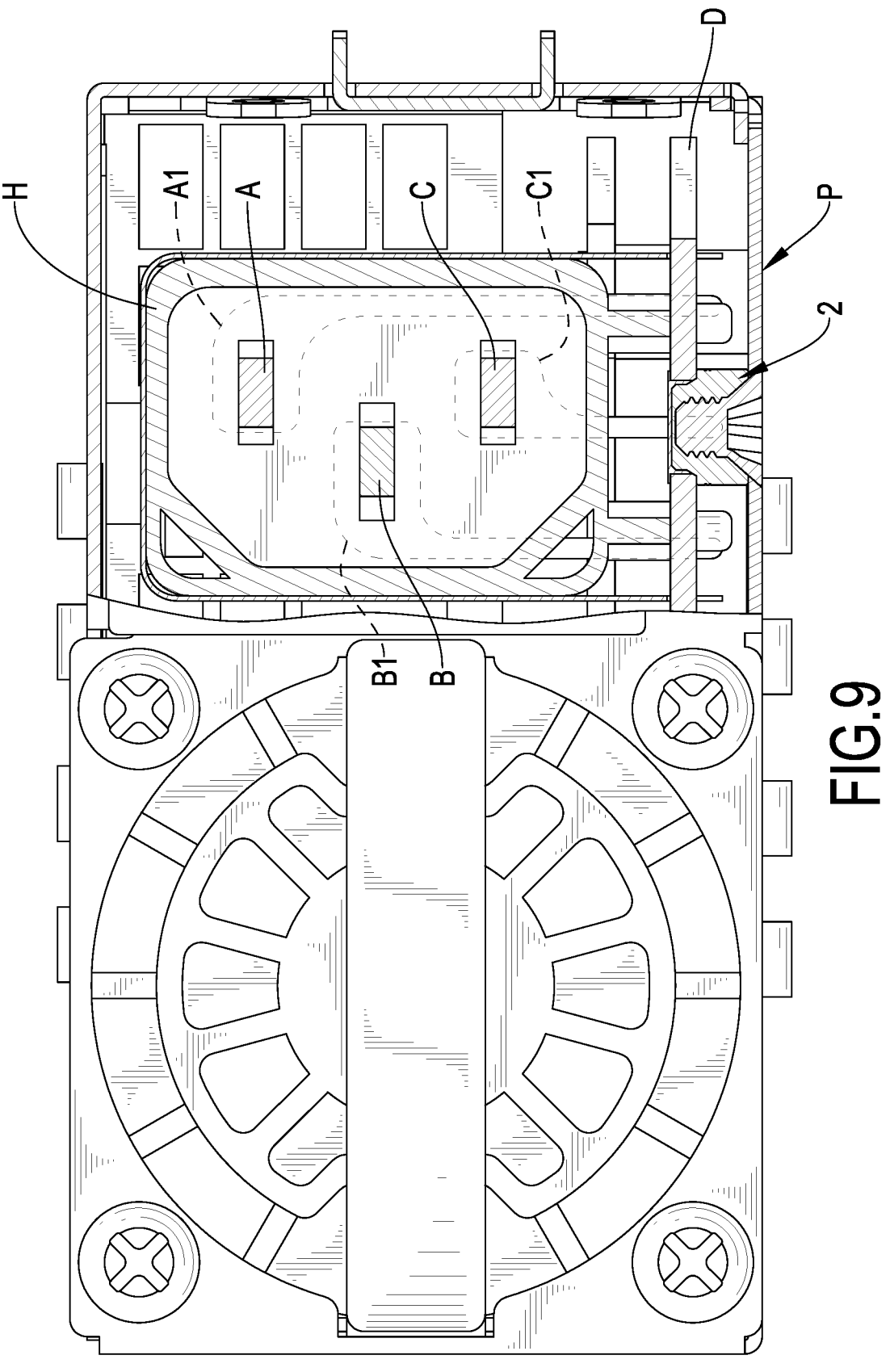
FIGS. 9, 10 and 11 are a front cross-sectional view and side cross-sectional views of the second embodiment of the ground point fixing device for a power supply module of the present invention, as the ground point fixing device disposed below the conductor pins of the power supply module.
Figure 10:
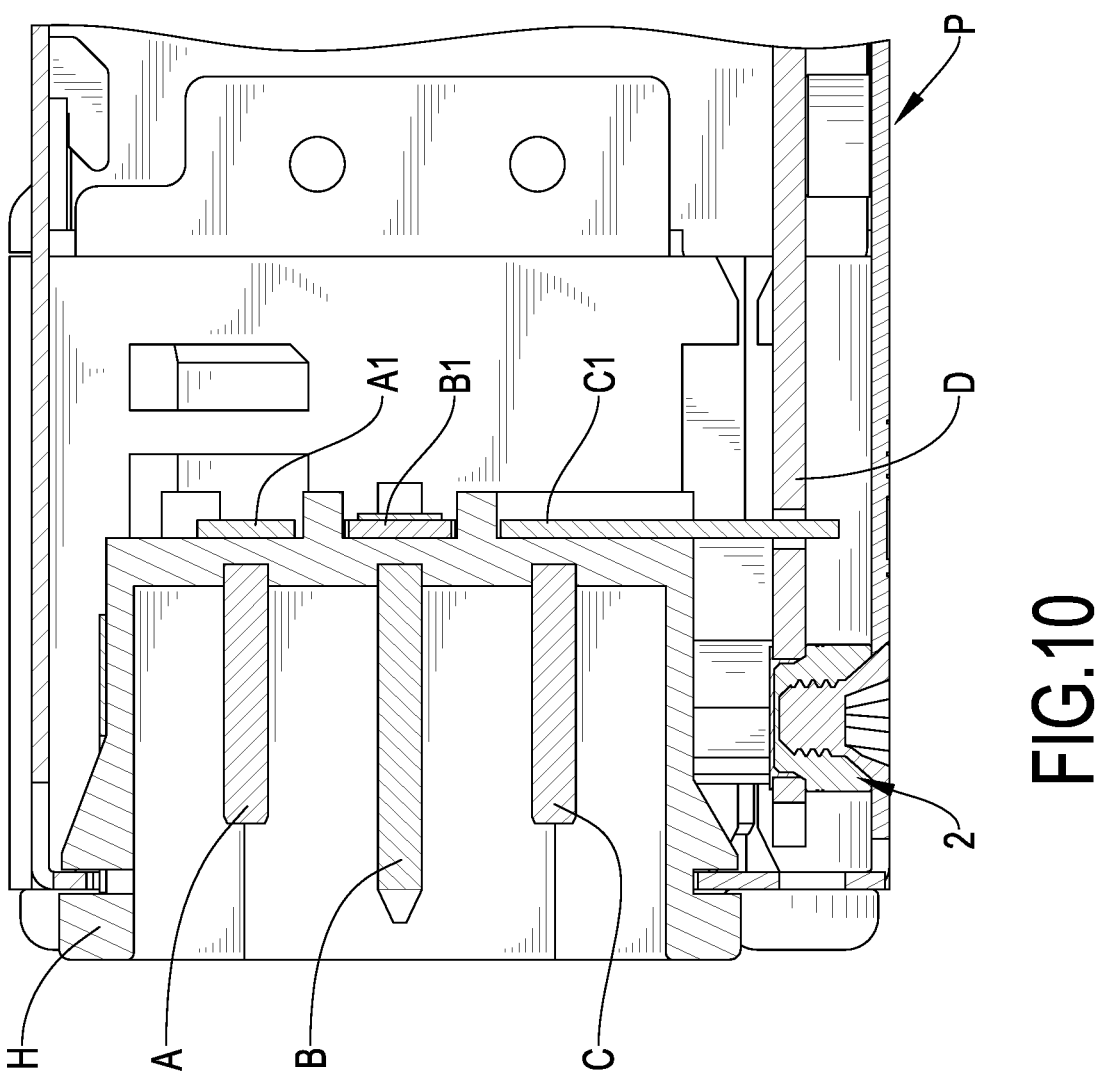
Figure 11:
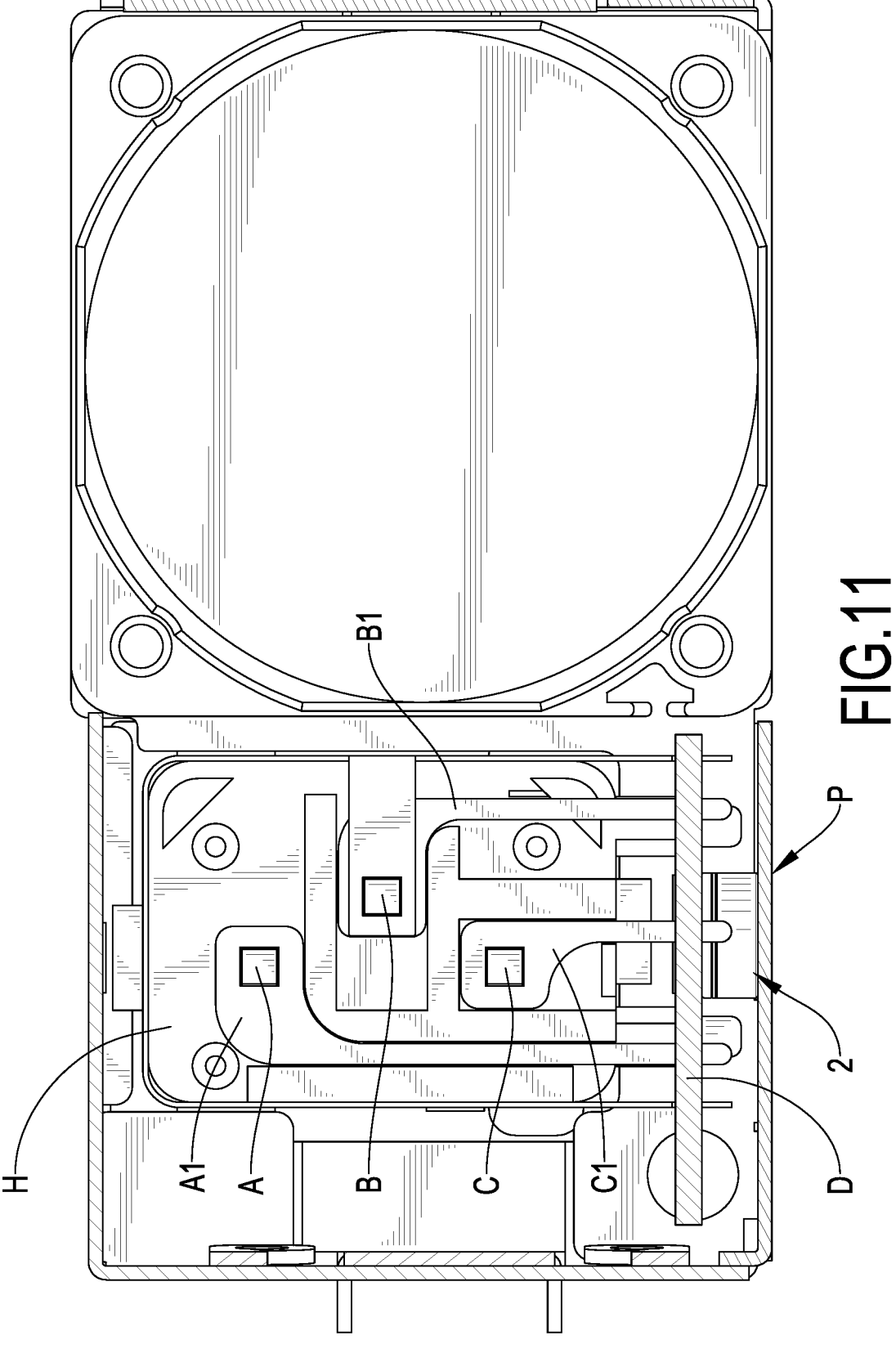

Please refer to FIGS. 9, 10 and 11, which are a front sectional view, a side sectional view and a rear view of the second embodiment of the present invention in which the ground point fixing device 2 is disposed below the conductor pins of the power supply module. In this embodiment, when the engaging part 13 of the ground point fixing device 2 is engaged with the grounding hole D1 of the circuit board D, and as the circuit board D is stably fixed with the engaging part 13, the fastening part 14 is disposed in the grounding hole D1 of the circuit board D to further stably fix the circuit board D with the engaging part 13. In this embodiment, the grounding hole D1 is filled with solder to firmly connect the circuit board D and the engaging part 13. Similar principles are as described in the above embodiments and will not be described again here.

In summary, the ground point fixing device for a power supply module of the present invention can achieve a double stabilizing effect for the circuit board grounding point that complies with safety regulations through the engaging structure of the engaging part and the fastening structure of the fastening part. In addition, regarding arrangement of the internal space of the power supply module, the present invention can more effectively utilize the internal space of the power supply module by disposing the ground point fixing device below the conductor pin of the power supply module.

Although the present invention has been disclosed as above by way of a preferred embodiment, it is not intended to limit the present invention, and any one skilled in the art may make certain changes and modifications without departing from the spirit and scope of the present invention, and therefore the scope of protection of the present invention shall be subject to the scope of the appended patent claims as defined herein.

What is claimed is:

1. A ground point fixing device for a power supply module, comprising:

an engaging part, comprising:

an engagement body having a body outer diameter and a body surface, and the body outer diameter being larger than a grounding hole of a circuit board of the power supply module;

a joining portion disposed on the body surface and having a joining portion outer diameter which is smaller than the grounding hole; and an engagement portion, disposed on the body surface and around an outer circumference of the joining portion; and a fastening part;

wherein the joining portion is passed through the grounding hole to be connected to the fastening part such that the engagement portion of the engaging part is engaged in the grounding hole, and the fastening part and the engagement body of the engaging part are respectively fixed on a first surface and a second surface of the circuit board, wherein the second surface is opposite to the first surface;

wherein the ground point fixing device is provided below a socket of the power supply module; and wherein the engagement body of the engaging part includes a base portion, which is disposed on the body surface and has a base outer diameter; wherein the base outer diameter is smaller than the grounding hole and larger than the joining portion outer diameter, and the joining portion is disposed on top of the base portion, and the engagement portion is disposed around an outer circumference of the base portion.

2. The ground point fixing device for a power supply module as claimed in claim 1, wherein the fastening part includes a pressing portion, which is disposed around an outer diameter of the fastening part to press an upper surface of the circuit board.

3. The ground point fixing device for a power supply module as claimed in claim 2, wherein the pressing portion is a pawl.

4. The ground point fixing device for a power supply module as claimed in claim 1, wherein the joining portion is a screw body and the fastening part is a screw nut.

5. The ground point fixing device for a power supply module as claimed in claim 1, wherein the engagement portion includes a plurality of wedge-shaped blocks, and each of the plurality of wedge-shaped blocks has an inclined surface in contact with the grounding hole.

6. The ground point fixing device for a power supply module as claimed in claim 1, wherein the body surface of the engagement body is in contact with a lower surface of the circuit board.

7. The ground point fixing device for a power supply module as claimed in claim 1, wherein the fastening part is a solder, and the solder connects with the outer circumference of the joining portion and a connecting surface of the joining portion.

* * * * *